(12) United States Patent
Azumano

(10) Patent No.: US 11,437,224 B2
(45) Date of Patent: Sep. 6, 2022

(54) PLASMA PROCESSING APPARATUS

(71) Applicant: Shibaura Mechatronics Corporation, Yokohama (JP)

(72) Inventor: Hidehito Azumano, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 178 days.

(21) Appl. No.: 17/009,921

(22) Filed: Sep. 2, 2020

(65) Prior Publication Data

US 2021/0074530 A1    Mar. 11, 2021

(30) Foreign Application Priority Data

Sep. 9, 2019 (JP) .............................. JP2019-163822
Jul. 7, 2020 (JP) .............................. JP2020-117323

(51) Int. Cl.
*H01J 37/32* (2006.01)
(52) U.S. Cl.
CPC .. *H01J 37/32972* (2013.01); *H01J 37/32816* (2013.01); *H01J 37/32963* (2013.01)
(58) Field of Classification Search
CPC ...... G01J 1/0414; G01J 1/0266; G01J 1/0411; G01J 1/22; H01J 37/32972; H01J 37/32816; H01J 37/32963
See application file for complete search history.

(56) References Cited

U.S. PATENT DOCUMENTS

2015/0168231 A1   6/2015  Koshimizu et al.
2020/0124399 A1*  4/2020  Lian ................... H01J 37/32963

FOREIGN PATENT DOCUMENTS

JP    2006-024764 A    1/2006
JP    2007-066935 A    3/2007
JP    2015-114313 A    6/2015

* cited by examiner

*Primary Examiner* — Henry Luong
(74) *Attorney, Agent, or Firm* — Pearne & Gordon LLP

(57) ABSTRACT

According to one embodiment, a plasma processing apparatus includes a chamber configured to maintain an atmosphere depressurized below atmospheric pressure, a gas supply part configured to supply a gas into the chamber, a placement part provided inside the chamber, and configured to place a processed product, a depressurization part configured to depressurize inside the chamber, a window provided in the chamber, and facing the placement part, a plasma generator provided outside the chamber and on a surface of the window on an opposite side to the placement part, and configured to generate plasma inside the chamber, an optical path changing part provided inside the window and having a surface tilted to a central axis of the chamber, and a detection part provided on a side surface side of the window, and facing the surface of the optical path changing part.

18 Claims, 8 Drawing Sheets

PLASMA PROCESSING APPARATUS

CROSS-REFERENCE TO RELATED APPLICATIONS

This application is based upon and claims the benefit of priority from Japanese Patent Application No. 2019-163822, filed on Sep. 9, 2019; No. 2020-117323, filed on Jul. 7, 2020; the entire contents of which are incorporated herein by reference.

FIELD

Embodiments described herein relate generally to a plasma processing apparatus.

BACKGROUND

A plasma processing apparatus used for dry etching or the like is provided with a detection part that detects a state of a processed product. For example, in detecting the end point of the plasma processing, the end point of the processing is detected based on the change in the scattering intensity of the light with which the surface of the processing product is irradiated. Further, in detecting the end point of the plasma processing, the end point of the processing may be detected based on a change in the emission spectrum of plasma. Further, in the detection of the end point of the plasma processing, the end point of the processing may be detected based on the reflected light or the transmitted light in the region where the processing is performed. That is, generally, the end point of the plasma processing is detected based on the optical change that occurs during the plasma processing.

Here, a plasma processing apparatus including a detection window (transmission window) provided on the side surface of the chamber and a detection part provided outside the chamber for detecting plasma emission through the detection window has been proposed. Further, a plasma processing apparatus including a window having a plate shape and provided on the ceiling of the chamber, and a detection part that detects light that is incident on the window from the inside of the chamber, propagates through the window, and is radiated from the side surface of the window has been proposed. These detector parts detect light emission, for example, in a wide range such as the entire region where plasma is generated. In this case, the intensity of the light incident on the detection part is an average value of the intensity of the light in a wide range, so that it becomes difficult to detect a slight change on the surface of the processed product.

In recent years, downscaling of the processed portion has progressed, and for example, an opening ratio of the formed unevenness and holes may be 1% or less. In such a case, the amount of the substance to be removed becomes small, so that the change amount of light becomes minute. Therefore, when light emission in a wide range is detected, it becomes more difficult to detect a slight change on the surface of the processed product.

In this case, if the change of light in a narrow area can be detected, the end point of the processing can be detected accurately even in the case of fine processing, and thus the fine processing can be performed accurately.

Therefore, the development of a plasma processing device that can detect changes in light in a narrow area has been desired.

DETAILED DESCRIPTION

Figure 1:
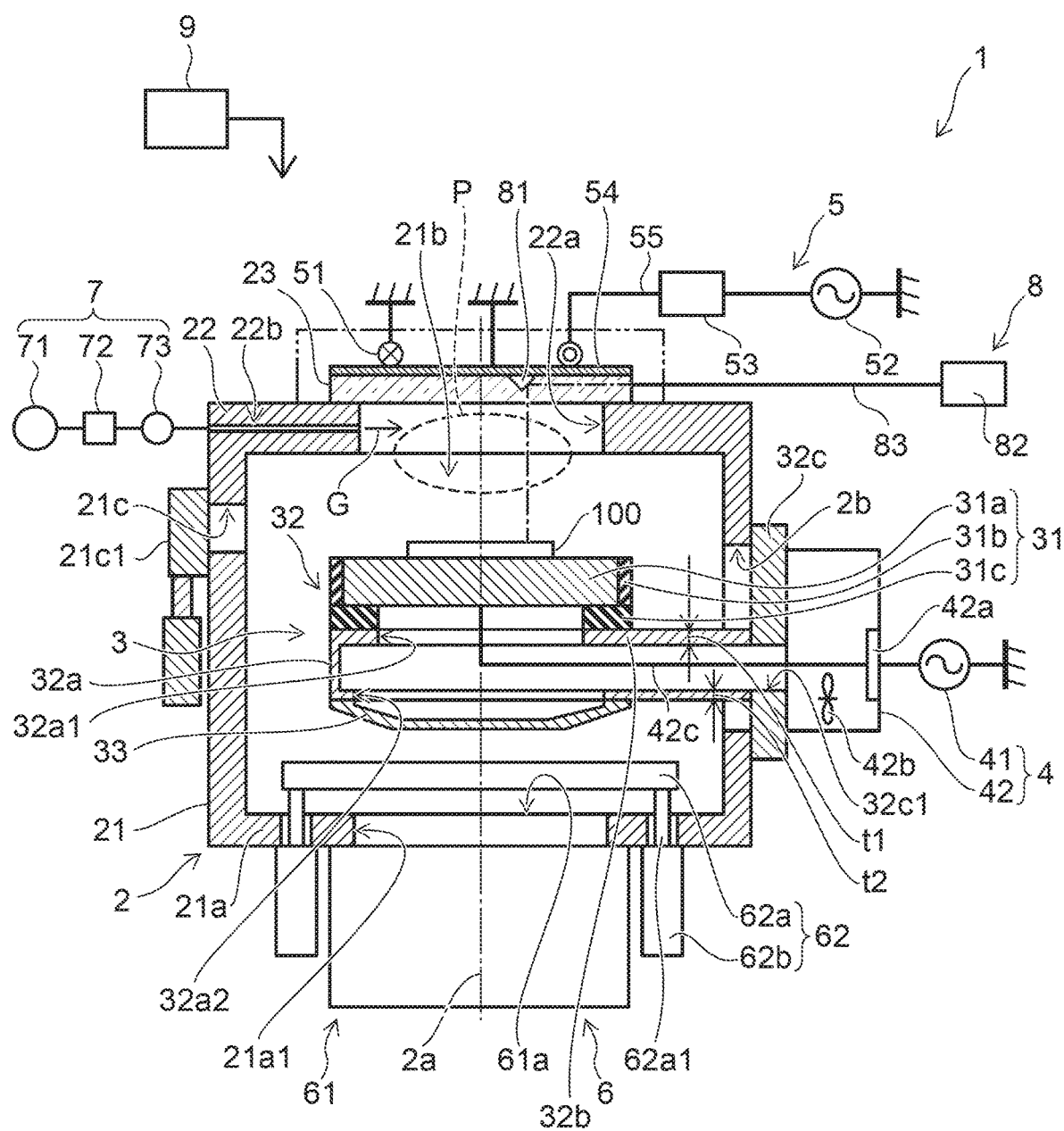
FIG. 1 is a schematic cross-sectional view for illustrating a plasma processing apparatus according to the embodiment.

According to one embodiment, a plasma processing apparatus includes a chamber, a gas supply part, a placement part, a depressurization part, a window, a plasma generator, an optical path changing part, and a detection part. The chamber is configured to maintain an atmosphere depressurized below atmospheric pressure. The gas supply part is configured to supply a gas into the chamber. The placement part is provided inside the chamber, and configured to place a processed product. The depressurization part is configured to depressurize inside the chamber. The window is provided in the chamber, and faces the placement part. The plasma generator is provided outside the chamber and on a surface of the window on an opposite side to the placement part, and configured to generate plasma inside the chamber. The optical path changing part is provided inside the window and has a surface tilted to a central axis of the chamber. The detection part is provided on a side surface side of the window, and faces the surface of the optical path changing part.

Various embodiments are described below with reference to the accompanying drawings.

In the drawings, similar components are marked with like reference numerals, and a detailed description is omitted as appropriate.

FIG. 1 is a schematic cross-sectional view for illustrating a plasma processing apparatus 1 according to the embodiment.

Figure 2:
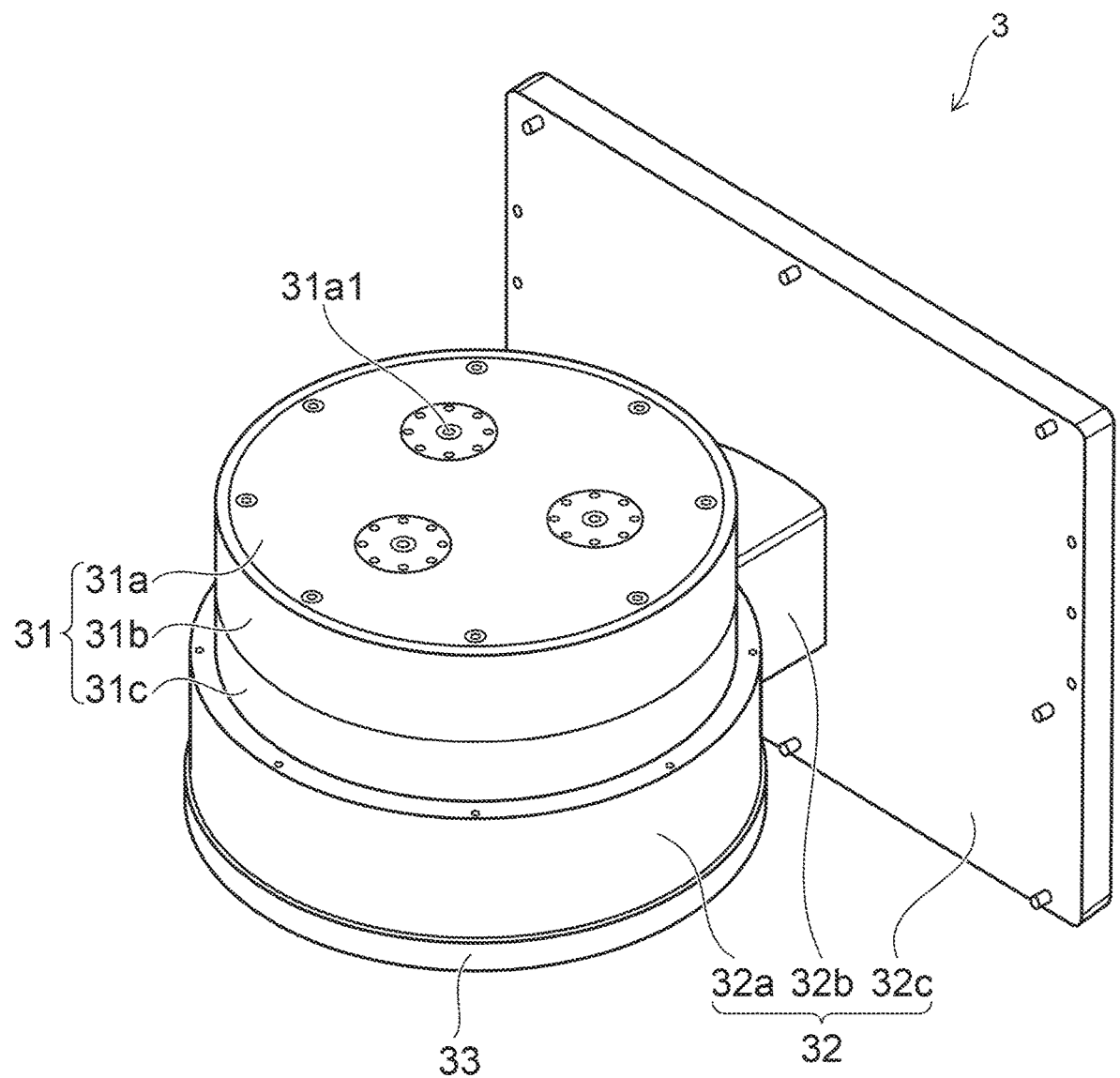
FIG. 2 is a schematic perspective view for illustrating a placement module.

FIG. 2 is a schematic perspective view for illustrating a placement module 3.

As shown in FIG. 1, the plasma processing apparatus 1 may include a chamber 2, a placement module 3, a power supply part 4, a power supply part 5, a depressurization part 6, a gas supply part 7, a processing state detection part 8, and a controller 9.

The chamber 2 may have an airtight structure capable of maintaining an atmosphere that is depressurized below atmospheric pressure.

The chamber 2 may include a main body part 21, a top plate 22, and a window 23.

The main body part 21 presents a substantially cylindrical shape, and a bottom plate 21a is integrally provided at one end. The other end of the main body part 21 is open. The main body part 21 can be formed of, for example, a metal such as an aluminum alloy. Moreover, the main body part 21 can be grounded. Inside the main body part 21, a region 21b where the plasma P is generated is provided. The main body part 21 can be provided with a carry-in/carry-out port 21c for carrying in and carrying out the processed product 100. The carry-in/carry-out port 21c can be airtightly closed by a gate valve 21c1.

The processed product 100 can be, for example, a photomask, a mask blank, a wafer, a glass substrate, or the like. However, the processed product 100 is not limited to the illustrated one.

The top plate 22 presents a plate shape and can be provided so as to close an opening of the main body part 21. The top plate 22 can be provided so as to face the bottom plate 21a. A hole 22a piercing in a thickness direction can be provided in a central region of the top plate 22. The center of the hole 22a can be provided on the central axis 2a of the chamber 2 (main body part 21). The hole 22a can be provided for transmitting an electromagnetic wave emitted from an electrode 51 described later. The top plate 22 can be formed of, for example, a metal such as an aluminum alloy.

The window 23 presents a plate shape and can be provided on the top plate 22. The window 23 can be provided so as to close the hole 22a. That is, the window 23 is provided in the chamber 2 and faces the placement part 31. The window 23 can transmit light and an electromagnetic field, and can be formed of a material that is difficult to be etched when an etching process is performed. The window 23 can be formed of, for example, a dielectric material such as quartz.

As shown in FIGS. 1 and 2, the placement module 3 may include the placement part 31, a supporting part 32, and a cover 33. The placement module 3 may have a cantilever structure in which the placement part 31 is provided on the tip side so as to project from the side surface of the chamber 2 (main body part 21) into the chamber 2 (main body part 21). The processed product 100 can be placed on the placement part 31. The placement part 31 is positioned below the region 21b where the plasma P is generated.

The placement part 31 may include an electrode 31a, an insulating ring 31b, and a pedestal 31c.

The electrode 31a can be formed of a conductive material such as a metal. The upper surface of the electrode 31a can be a placement surface on which the processed product 100 is placed. The electrode 31a can be screwed to the pedestal 31c, for example. Further, the electrode 31a may incorporate a pickup pin 31a1 (see FIG. 2), a temperature controller, and the like therein. Multiple pickup pins 31a1 can be provided.

The multiple pickup pins 31a1 present a rod shape and can be provided so as to be able to project from the upper surface of the electrode 31a. The multiple pickup pins 31a1 can be used when the processed product 100 is delivered. Therefore, the multiple pickup pins 31a1 can be projected from the upper surface of the electrode 31a and pulled into the electrode 31a by a drive part (not shown). The number and arrangement of the multiple pickup pins 31a1 can be appropriately changed according to the size and the planar shape of the processed product 100.

The temperature controller can be, for example, a refrigerant circulation line (flow path) or a heater. The temperature controller, for example, can control the temperature of the electrode 31a and further the temperature of the processed product 100 placed on the electrode 31a based on the output from a temperature sensor (not shown).

The insulating ring 31b presents a ring shape and can cover the side surface of the electrode 31a. The insulating ring 31b can be formed of, for example, a dielectric material such as quartz.

The pedestal 31c can be provided between the electrode 31a and an attachment part 32a of the supporting part 32. The pedestal 31c can be provided to insulate between the electrode 31a and the supporting part 32. The pedestal 31c can be formed of, for example, a dielectric material such as quartz. The pedestal 31c can be screwed to the attachment part 32a of the supporting part 32, for example.

The supporting part 32 can support the placement part 31 in the internal space of the chamber 2. The supporting part 32 may extend between the side surface of the chamber 2 and the lower portion of the placement part 31.

The supporting part 32 may include the attachment part 32a, a beam 32b, and a flange 32c. The attachment part 32a, the beam 32b, and the flange 32c can be formed of, for example, an aluminum alloy.

The attachment part 32a can be positioned below the placement part 31 in the internal space of the chamber 2. The attachment part 32a can be provided so that the center of the attachment part 32a is positioned on the central axis 2a of the chamber 2. The attachment part 32a presents a tubular shape, and a hole 32a1 can be provided in the end surface on the placement part 31 side. A hole 32a2 can be provided in the end surface on the side opposite to the placement part 31 side. The bus bar 42c, the pipe for the refrigerant, and the like can be connected to the electrode 31a through the hole 32a1.

The hole 32a2 can be used when connecting the bus bar 42c, a refrigerant pipe, or the like, or when performing maintenance of the electrode 31a. The placement part 31 (pedestal 31c) can be provided on the end surface of the attachment part 32a on the placement part 31 side. Therefore, the planar shape of the attachment part 32a can be the same as the planar shape of the placement part 31. The plane dimension of the attachment part 32a can be made approximately the same as or slightly larger than the plane dimension of the placement part 31.

One end of the beam 32b can be connected to the side surface of the attachment part 32a. The other end of the beam 32b can be connected to the flange 32c. The beam 32b can extend in the internal space of the chamber 2 from the side surface of the chamber 2 toward the central axis 2a of the chamber 2. The beam 32b may present a rectangular tubular shape. The internal space of the beam 32b can be connected to a space (atmospheric space) outside the chamber 2 through a hole 32c1 provided in the flange 32c. Therefore, the bus bar 42c can contact the atmospheric space. If the internal space of the beam 32b is connected to the external space of the chamber 2, the pressure of the internal space of the beam 32b becomes the same as the pressure of the external space of the chamber 2 (for example, atmospheric pressure). Further, the internal space of the beam 32b can be connected to the internal space of the attachment part 32a. In this case, the pressure of the internal space of the supporting part 32 becomes the same as the pressure of the space outside the chamber 2 (for example, atmospheric pressure).

The flange 32c presents a plate shape and can include a hole 32c1 piercing in the thickness direction. The flange 32c can be attached to the outer wall of the chamber 2, and can be screwed to the outer wall of the chamber 2, for example.

A hole 2b can be provided on the side surface of the chamber 2. The hole 2b may have a size and a shape that allow the placement part 31 attached to the attachment part 32a to pass therethrough. Therefore, the placement module 3 provided with the placement part 31 can be removed from the chamber 2 or the placement module 3 provided with the placement part 31 can be attached to the chamber 2 through the hole 2b.

That is, the attachment part 32a and the beam 32b provided with the placement part 31 can be carried into the chamber 2 and carried out of the chamber 2 through the hole 2b. It should be noted that a slider may be provided on the outer wall of the chamber 2 in order to facilitate attaching and detaching of the placement module 3.

The cover 33 can be provided on the end surface of the attachment part 32a opposite to the placement part 31 side. The cover 33 can be screwed to the attachment part 32a, for example. By attaching the cover 33 on the attachment part 32a, the hole 32a2 can be hermetically closed. The shape of the cover 33 is not particularly limited, and may be a dome-shaped cover 33 or a plate-shaped cover 33. The cover 33 can be formed of, for example, an aluminum alloy.

Here, if the supporting part 32 having a cantilever structure is used, a space can be provided below the placement part 31 in the internal space of the chamber 2, so that a depressurized part 6 is possible to be disposed immediately below the placement part 31. If the depressurized part 6 can be disposed immediately below the placement part 31, it becomes easy to perform an axisymmetric exhaust that has a high effective pumping speed and is not biased. Further, if the supporting part 32 having the cantilever structure is used, the supporting part 32 provided with the placement part 31 can be removed from the chamber 2 in the horizontal direction, or the supporting part 32 provided with the placement part 31 can be attached to the chamber 2 in the horizontal direction. Therefore, maintenance of the plasma processing apparatus is easier than when the placement part 31 is fixed to the bottom surface of the chamber 2.

However, the placement part 31 is provided with the metal electrode 31a. In addition, the placement part 31 is also provided with the pickup pins 31a1, a drive part thereof, a temperature controller such as a refrigerant circulation line and a heater. Therefore, the weight of the placement part 31 becomes heavy. Since the supporting part 32 has the cantilever structure, if the weight of the placement part 31 provided on the distal end side becomes heavy, the load is biased, and the tip end of the beam 32b supporting the placement part 31 may bend downward. If the tip of the beam 32b bends downward, the placement part 31 may be tilted. For example, the weight of the placement part 31 may be 56 to 70 kgf (weight kilogram). In such a case, the tip of the placement module 3 may drop downward by about 0.2 mm.

Since the processed product 100 is placed on the placement part 31, the placement surface on which the processed product 100 is placed needs to have an area at least larger than the area of the major surface of the processed product 100. Therefore, the plane size of the placement part 31 becomes large. If the placement part 31 having a large plane dimension is tilted, the gas flow in the chamber 2 may be disturbed or the plasma density may be non-uniform, resulting in non-uniform processing characteristics.

In this case, if the cross-sectional dimension of the beam 32b that supports the placement part 31 is increased in order to suppress the tilt of the placement part 31, the exhaust is blocked, the effective pumping speed is reduced, and thereby exhaust may be difficult, in which there is no deviation and the axis is symmetrical. In this case, if the number of the beams 32b supporting the placement part 31 is multiple, the cross-sectional size of one beam 32b can be reduced, and thus the reduction of the effective pumping speed can be suppressed. Further, if the disposition of the multiple beams 32b is devised, it is possible to perform axisymmetric exhaust. However, if the multiple beams 32b are used, the size of the portion fixed to the side surface of the chamber 2 becomes large, so that attachment and detachment of the supporting part 32 becomes difficult, and maintainability may deteriorate.

Therefore, the supporting part 32 according to the embodiment is provided with the beam 32b having a space inside. Then, as described above, the internal space of the beam 32b is connected to the external space of the chamber 2. That is, the pressure in the internal space of the beam 32b is the same as the pressure in the external space of the chamber 2 (for example, atmospheric pressure). Further, a wall thickness of the side portion (upper side portion) of the beam 32b on the placement part 31 side is set to t1, and a wall thickness of the side portion (lower side portion) of the beam 32b opposite to the placement part 31 side is t2, and then "t1>t2" will be satisfied.

Therefore, when performing the plasma processing, a uniformly distributed load corresponding to the difference between the pressure inside the beam 32b and the pressure outside the beam 32b will be applied to the upper side portion and the lower side portion of the beam 32b. In this case, the uniformly distributed load applied to the upper side portion and the lower side portion of the beam 32b becomes equal. Therefore, if "t1>t2" is satisfied, the amount of deflection of the upper side portion of the beam 32b becomes larger than the amount of deflection of the lower side portion of the beam 32b. As a result, since the tip of the beam 32b is bent upward, the downward bending due to the weight of the placement part 31 can be offset by the upward bending due to the pressure difference. The specific dimensions of the wall thicknesses t1 and t2 can be appropriately determined by conducting experiments and simulations.

Next, returning to FIG. 1, the power supply part 4, the power supply part 5, the depressurization part 6, the gas supply part 7, the processing state detection part 8, and the controller 9 will be described.

The power supply part 4 can be a so-called high frequency power supply for bias control. That is, the power supply part 4 can be provided to control the energy of the ions that are drawn into the processed product 100 on the placement part 31.

The power supply part 4 can include a power supply 41 and a matching part 42.

The power supply 41 can output high frequency power having a frequency suitable for attracting ions (for example, a frequency of 27 MHz to 1 MHz).

The matching part 42 can have a matching circuit 42a, a fan 42b, and the bus bar 42c.

The matching circuit 42a can be provided for matching between the impedance on the power supply 41 side and the impedance on the plasma P side. The matching circuit 42a can be electrically connected to the power supply 41 and the electrode 31a via the bus bar (wiring member) 42c. That is, the power supply 41 can be electrically connected to the electrode 31a provided on the placement part 31 via the bus bar 42c.

The fan 42b can send air to the inside of the supporting part 32. The fan 42b can be provided to cool the bus bar 42c and the matching circuit 42a provided inside the supporting part 32.

Further, the matching part 42 can be provided on the flange 32c of the supporting part 32. If the matching part 42 is provided on the flange 32c, when the placement module 3 is removed from the chamber 2 (main body part 21) or the placement module 3 is attached to the chamber 2 (main body part 21), the placement module 3 and the matching part 42 can be moved together. Therefore, the maintainability can be improved.

The internal space of the beam 32b is connected to the external space of the chamber 2 (main body part 21) via the matching part 42. Therefore, the pressure in the internal space of the beam 32b can be the same as the pressure in the external space of the chamber 2 (for example, atmospheric pressure).

The power supply part 5 can be a high frequency power supply for generating the plasma P. That is, the power supply part 5 can be provided to generate high-frequency discharge and generate the plasma P inside the chamber 2.

In the embodiment, the power supply part 5 is provided outside the chamber 2 on the surface of the window 23 opposite to the placement part 31 side, and becomes a plasma generator which generates plasma P inside the chamber 2.

The power supply part 5 can include the electrode 51, a power supply 52, a matching circuit 53, and a Faraday shield 54.

The electrode 51 can be provided outside the chamber 2 and above the window 23. The electrode 51 may include multiple conductors that generate an electromagnetic field and multiple capacitors (capacitors).

The power supply 52 can output high frequency power having a frequency of about 100 KHz to 100 MHz. In this case, the power supply 52 can output high frequency power having a frequency suitable for generating the plasma P (for example, a frequency of 13.56 MHz). Further, the power supply 52 may change the frequency of the high frequency power to be output. The matching circuit 53 can be provided to match the impedance on the power supply 52 side and the impedance on the plasma P side. The matching circuit 53 can be electrically connected to the power source 52 and the electrode 51 via a wiring 55. The matching circuit 53 can also be electrically connected to the power supply 52 and the electrode 51 via a bus bar.

The Faraday shield 54 can be provided between the window 23 and the electrode 51. The Faraday shield 54 presents a plate shape and can be formed of a conductive material such as a metal. The Faraday shield 54 can include multiple slits extending radially from the center. An insulating film made of an insulating material can be provided on the surface of the Faraday shield 54 on the electrode 51 side. A portion of the Faraday shield 54 made of a conductive material can be grounded.

The plasma processing apparatus 1 illustrated in FIG. 1 is a dual frequency plasma processing apparatus including an inductively coupled electrode in the upper portion and a capacitively coupled electrode in the lower portion.

However, the plasma generation method is not limited to the illustrated one.

The plasma processing apparatus 1 may be, for example, a plasma processing apparatus using inductively coupled plasma (ICP) or a plasma processing apparatus using capacitively coupled plasma (CCP).

The depressurization part 6 is positioned below the placement part 31 and can depressurize the inside of the chamber 2 to a predetermined pressure.

The depressurization part 6 can include a pump 61 and a valve 62.

The pump 61 can be provided outside the chamber 2. The pump 61 can be connected to the hole 21a1 provided in the bottom plate 21a of the chamber 2. The pump 61 can exhaust the gas inside the chamber 2. The pump 61 can be, for example, a turbo molecular pump (TMP) or the like. A roots type dry pump can be connected to the turbo molecular pump as the back pump.

The valve 62 can include a valve disc 62a and a drive part 62b.

The valve disc 62a presents a plate shape and can be provided inside the chamber 2. The valve disc 62a can face the hole 21a1. The plane size of the valve disc 62a can be made larger than the plane size of the intake port 61a. When the valve disc 62a is viewed from the central axis 2a direction, the valve disc 62a can cover the intake port 61a of the pump 61.

The drive part 62b can change the position of the valve disc 62a in the direction of the central axis 2a of the chamber 2 (main body part 21). That is, the drive part 62b can raise the valve disc 62a and lower the valve disc 62a. The drive part 62b can include a shaft 62a1 connected to the valve disc 62a and a control motor (for example, a servomotor) that moves the shaft 62a1. The valve 62 can be a so-called poppet valve.

Here, when the position of the valve disc 62a changes inside the chamber 2, the distance between the valve disc 62a and the bottom plate 21a of the chamber 2 changes. A space between the valve disc 62a and the bottom plate 21a of the chamber 2 serves as an exhaust passage. Therefore, since the conductance changes when the size of this portion is changed, it is possible to control the exhaust amount and the pumping speed. The controller 9 can change the position of the valve disc 62a by controlling the drive part 62b based on the output of, for example, a vacuum gauge (not shown) that detects the internal pressure of the chamber 2. The vacuum gauge may be a diaphragm type capacitance manometer or the like.

The gas supply part 7 can supply the gas G to the region 21b in the chamber 2 where the plasma P is generated.

The gas supply part 7 can include a gas storage part 71, a gas controller 72, and an on-off valve 73. The gas storage part 71, the gas controller 72, and the on-off valve 73 can be provided outside the chamber 2.

The gas storage part 71 can store the gas G and supply the stored gas G to the inside of the chamber 2. The gas storage part 71 can be, for example, a high-pressure cylinder that stores the gas G. The gas storage part 71 and the gas controller 72 can be connected via a pipe.

The gas controller 72 can control the flow rate and pressure of the gas G supplied from the gas storage part 71 to the inside of the chamber 2. The gas controller 72 can be, for example, an MFC (Mass Flow Controller) or the like. The gas controller 72 and the on-off valve 73 can be connected via a pipe.

The on-off valve 73 can be connected to a gas supply port 22b provided in the chamber 2 via a pipe. Multiple gas supply ports 22b may be provided so that the gas G is uniformly supplied to the region 21b where the plasma P is generated from multiple directions. The on-off valve 73 can control supply and stop of the gas G. The on-off valve 73 can be, for example, a 2-port solenoid valve or the like. The function of the on-off valve 73 may be provided in the gas controller 72.

The gas G can generate desired radicals and ions when excited and activated by the plasma P. For example, when the plasma processing is an etching processing, the gas G may generate radicals or ions capable of etching the exposed surface of the processed product 100. In this case, the gas G can be, for example, a gas including chlorine, a gas including fluorine, or the like. The gas G can be, for example, a mixed gas of chlorine gas and oxygen gas, $CHF_3$, a mixed gas of $CHF_3$ and $CF_4$, a mixed gas of $SF_6$ and helium gas, and the like.

The processing state detection part 8 can detect the state of the processed product 100 based on an optical change that occurs during the plasma processing. For example, the processing state detection part 8 can detect the end point of the plasma processing.

The processing state detecting part 8 can include an optical path changing part 81 and a detection part 82.

The optical path changing part 81 can be provided inside the window 23. The optical path changing part 81 changes the optical path of the incident light between the direction from the window 23 toward the placement part 31 (thickness direction of the window 23) and the direction orthogonal to the direction from the window 23 toward the placement part 31 (direction orthogonal to the thickness direction of the window 23).

For example, the optical path changing part 81 can be locally provided inside the window 23 and have a surface (reflection surface) tilted with respect to the central axis 2a of the chamber 2.

Figure 3:
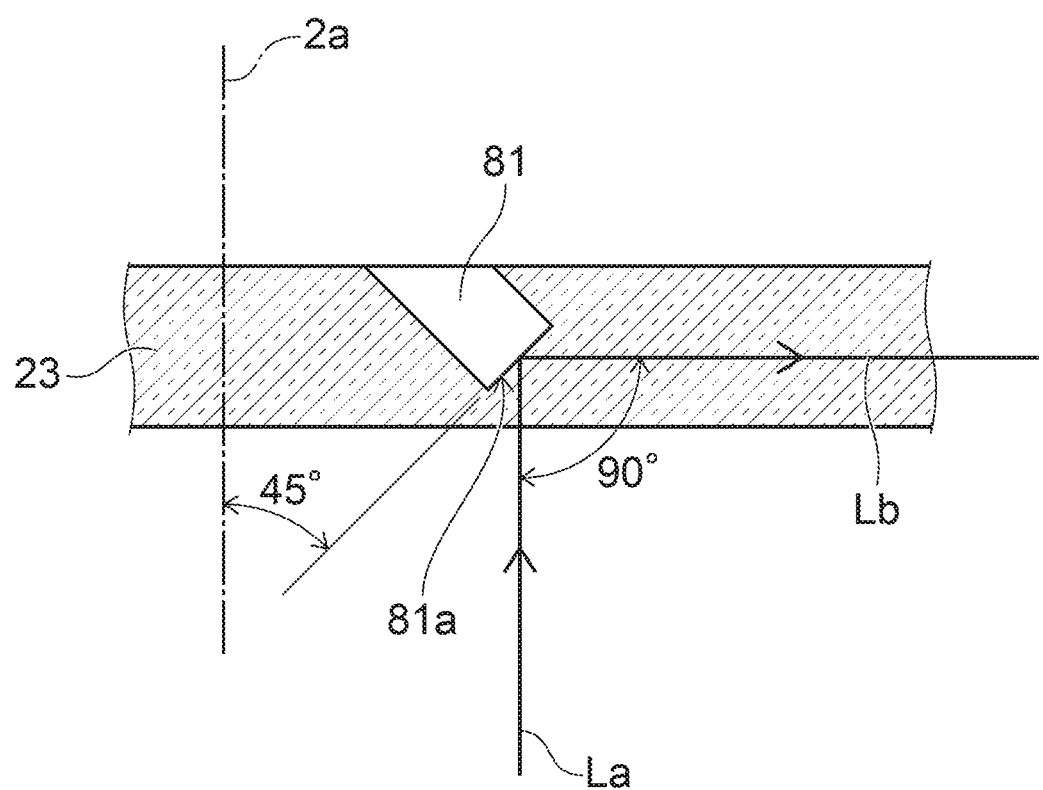
FIG. 3 is a schematic cross-sectional view for illustrating an optical path changing part.

FIG. 3 is a schematic cross-sectional view for illustrating the optical path changing part 81.

The optical path changing part 81 illustrated in FIG. 3 can be a recessed portion that opens on the surface of the window 23 opposite to the placement part 31 side. For example, the bottom surface of the recess that is the optical path changing part 81 is a flat surface, and the bottom surface is the surface 81a that is a reflection surface. The angle between the surface 81a and the central axis 2a of the chamber 2 can be 45°. The outer shape of the recess can be, for example, a column or a polygonal column.

As shown in FIG. 3, the optical path changing part 81 can reflect the incident light La so that the angle between the optical path of the incident light La and the optical path of the outgoing light Lb becomes 90°. That is, the incident angle of the light traveling from the detection part 82 toward the surface 81a to the surface 81a can be 45°. The reflection angle can be 45°.

In FIG. 3, the case where the light is incident from the thickness direction of the window 23 (the light is incident from the placement part 31 side to the optical path changing part 81) is illustrated, but even when the inspection light enters the optical path changing part 81 from the side surface side (the peripheral end face side) of the window 23, the traveling direction of the inspection light is changed by the optical path changing part 81. Then, the traveling direction of the inspection light emitted from the optical path changing part 81 and reflected by the processed product 100 is also changed by the optical path changing part 81 like the incident light La.

The optical path changing part 81 illustrated in FIG. 3 is the recess as described above. The inside of the optical path changing part 81 may be a space, or may be filled with gas, liquid, or solid. Further, a film including a material having a high reflectance (for example, a film including titanium oxide) can be formed on the surface 81a. When the inside of the optical path changing part 81 is filled with gas, liquid, or solid or a film is provided on the surface 81a, it is preferable to use gas, liquid, or solid having an insulating property. By doing so, it is possible to suppress the optical path changing part 81 from affecting the electromagnetic field formed by the power supply part 5.

Further, if the surface 81a has unevenness, light is scattered by the unevenness, so it is preferable to increase the flatness of the surface 81a. For example, the surface roughness of the surface 81a can be set to Ra 0.02 or less by optical polishing.

Figure 4A:
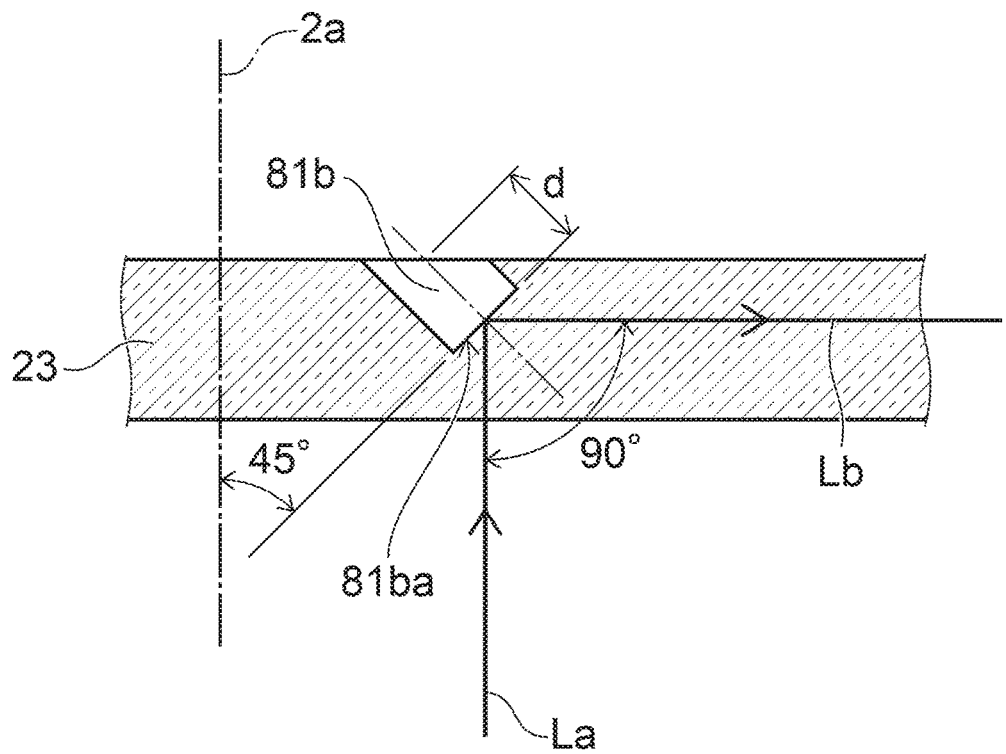
FIGS. 4A and 4B are schematic cross-sectional views for illustrating a modification of the optical path changing part.
Figure 4B:
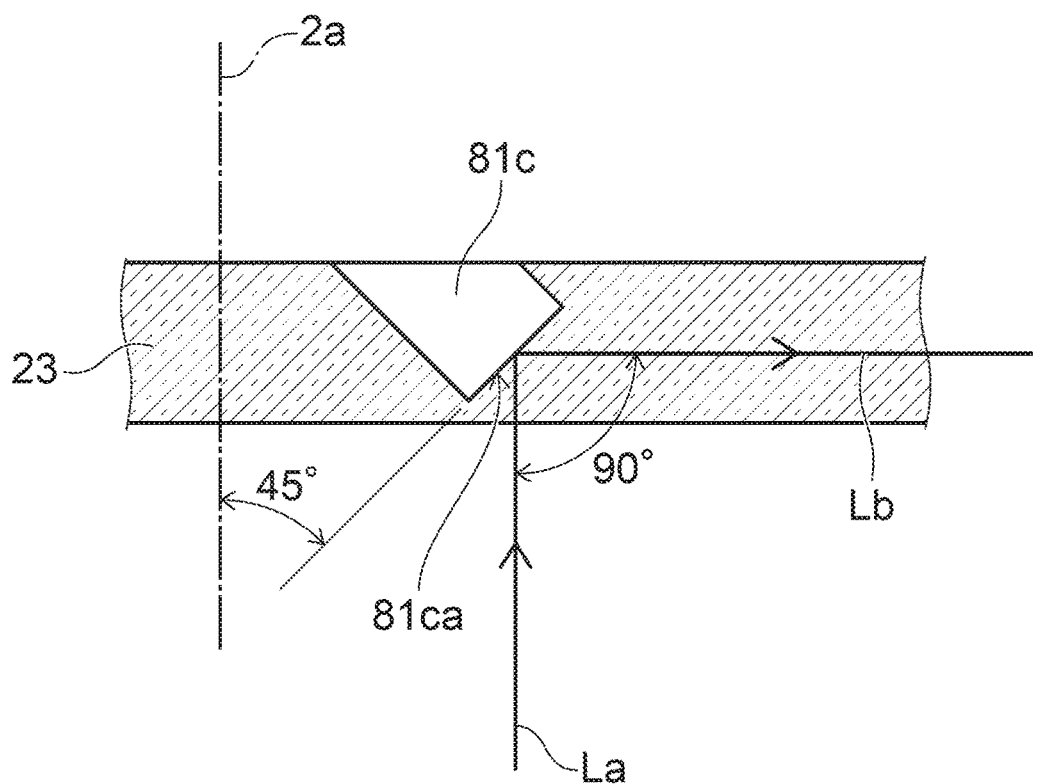

FIGS. 4A and 4B are schematic cross-sectional views for illustrating a modification of the optical path changing part.

As shown in FIG. 4A, an optical path changing part 81b having a small depth dimension d can be formed. If the depth dimension d is small, it is possible to shorten the length of the cutting tool used for cutting the recess to be the optical path changing part 81b. Since the length of the cutting tool is short, the rigidity of the cutting tool can be increased. Therefore, the vibration of the cutting tool is reduced, and flatness of a bottom surface (surface 81ba) of the recess serving as the optical path changing part 81b is improved. For example, when the surface 81ba has a circular shape, the depth dimension d is preferably 0.5 times or more and 1.0 times or less the diameter thereof. When the surface 81ba is a quadrangle, it is preferably 0.5 times or more and 1.0 times or less of the diameter of the inscribed circle.

Further, as shown in FIG. 4B, an optical path changing part 81c having a large bottom surface (surface 81ca) can be provided. By increasing the area of the surface 81ca, a cutting tool having a large cross-sectional area can be used. Since the cross-sectional area of the cutting tool is large, the rigidity of the cutting tool can be increased. Therefore, the vibration of the cutting tool is reduced, and the flatness of the bottom surface (the surface 81ca) of the recess serving as the optical path changing part 81c is improved.

The depth of the recess may be reduced and the area of the bottom surface of the recess may be increased. By doing so, the flatness of the bottom surface can be further improved. In addition, since optical polishing is facilitated, it becomes easier to set the flatness of the bottom surface to a desired value.

Here, it is preferable that the cross-sectional area of the optical path changing part 81 (see "D" in FIG. 6) in the direction orthogonal to the central axis 2a is 1.95% or less of the area of the surface of the window 23 opposite to the placement part 31 side. Alternatively, it is preferable that the load applied to the optical path changing part 81 is 9.8% or less of the allowable load of the window 23. If the load applied to the optical path changing part 81 is about this level, the durability of the window 23 having the optical path changing part 81 can be regarded as almost the same as the durability of the window having no optical path changing part 81. That is, in this way, the strength (vacuum resistance strength) of the window 23 can be maintained.

In addition, it is more preferable that the cross-sectional area of the optical path changing part 81 (see "D" in FIG. 6) in the direction orthogonal to the central axis 2a is 0.5% or less of the area of the surface of the window 23 opposite to the placement part 31 side. Alternatively, the load applied to the optical path changing part 81 is more preferably 5.0% or less of the allowable load of the window 23. By doing so, since the change in the capacitance of the window 23 can be made small, it is possible to prevent the optical path changing part 81 from affecting the electromagnetic field formed by the power supply part 5.

Figure 5:
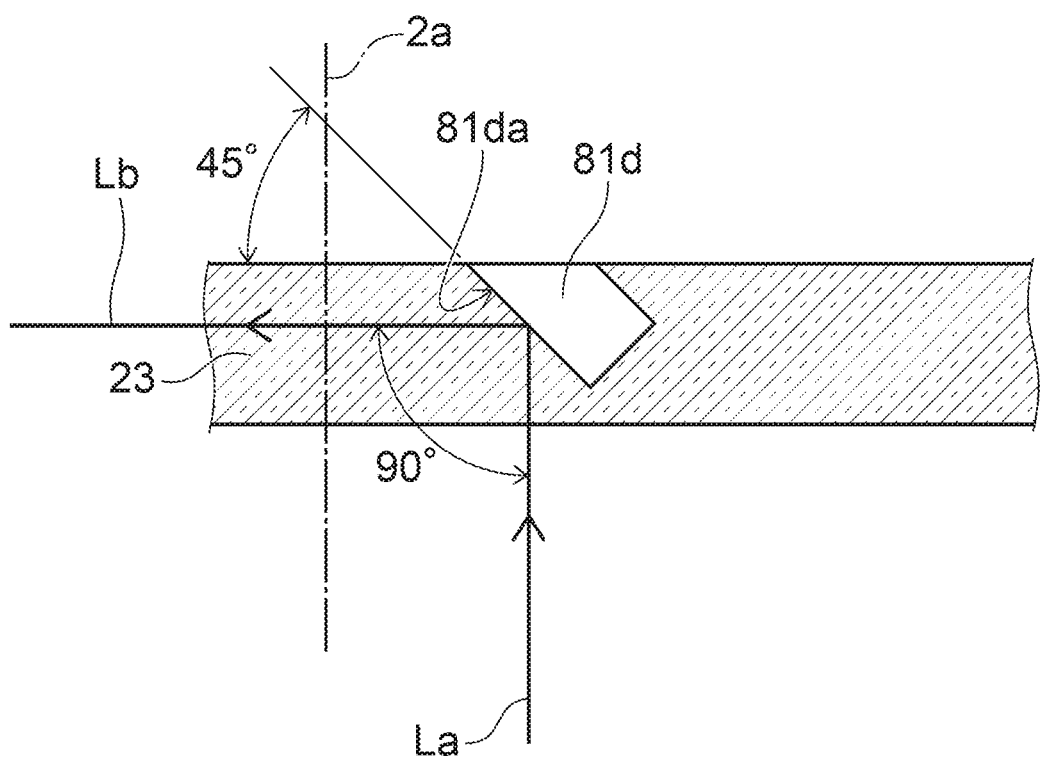
FIG. 5 is schematic cross-sectional view another modification of the optical path changing part.

FIG. 5 is a schematic cross-sectional view for illustrating other modification of the optical path changing part.

An optical path changing part 81d illustrated in FIG. 5 is a recess having a polygonal columnar shape (for example, a quadrangular prismatic shape) having a flat side surface 81da. The side surface 81da of the optical path changing part 81d is tilted at an angle of 45° with respect to the upper surface of the window 23 (the surface opposite to the placement part 31 side). With this configuration, the incident light La that is incident on the side surface 81da from the direction orthogonal to the upper surface of the window 23 can be the emitted light Lb reflected in the direction parallel to the upper surface of the window 23. In this case, the side surface of the recess can easily have a larger area than the bottom surface of the recess, and thus optical polishing can be easily performed.

Here, a part of the light that has entered the inside of the window 23 from the surface of the window 23 on the placement part 31 side reflects at the inside the window 23 and exits from the side surface (peripheral end surface) of the window 23 to the outside. Therefore, the detection part 82 can also detect the light emitted from the side surface of the window 23 to the outside. However, in this case, the intensity of the light incident on the detection part 82 becomes an average value of the intensity of the light in a relatively wide range, so that it becomes difficult to detect a slight change on the surface of the processed product 100.

In recent years, the downscaling of the processed portion has progressed, and for example, the opening ratio of the formed unevenness and holes may be 1% or less. In such a case, the amount of the substance to be removed becomes small, so that the change amount of light becomes minute. Therefore, when light emission in a wide range is detected, it becomes more difficult to detect a slight change on the surface of the processed product 100.

Further, as described above, the electrode 51, the Faraday shield 54, and the like are provided on the window 23. Therefore, if the light emitted in the thickness direction of the window 23 is detected, the electrode 51, the Faraday shield 54, and the like may interfere with the detection of light at an appropriate position.

As described above, the optical path changing part 81 can have a small cross-sectional area and can be provided at any position in the window 23. Therefore, it becomes possible to detect a change in light in a narrow area (detection area) at an appropriate position. As a result, it is possible to detect the end point of the plasma processing accurately even in the case of fine processing, and thus it is possible to perform fine processing accurately.

Moreover, since the angle between the optical path of the incident light and the optical path of the emitted light can be 90°, the detection part 82 can be disposed on the side surface side of the window 23. Therefore, it is possible to dispose the detection part 82 at an appropriate position regardless of the shape and disposition of the electrode 51, the Faraday shield 54, and the like.

The detection part 82 is provided on the side surface side of the window 23 and can be provided at a position facing the surface 81*a* of the optical path changing part 81.

If the optical path changing part 81 is provided, a part of the light generated inside the chamber 2 is reflected by the surface 81*a* of the optical path changing part 81 and enters the detection part 82. Therefore, the detection part 82 can include a light receiving part. For example, the detection part 82 can detect the state of the processed product 100 (for example, the end point of the plasma processing) based on the change in the wavelength of the light incident on the light receiving part via the optical path changing part 81.

The "position facing the surface 81*a* of the optical path changing part 81" means a position where the light reflected by the surface 81*a* (emitted light Lb) can be detected by the detection unit 82. The light (incident light La) incident on the inside of the window 23 from the surface of the window 23 on the side of the placement part 31 is reflected by the surface 81*a* of the optical path changing part 81.

Further, for example, the detection part 82 may include a light projecting part and a light receiving part. The light projecting part can irradiate the inspection light onto the surface of the processed product 100 via the optical path changing part 81. The light receiving part can receive the interference light of the light reflected by the surface of the processed product 100 and traveling toward the light receiving part via the optical path changing part 81 and the light emitted from the light projecting part. For example, the detection part 82 irradiates the surface of the processed product 100 with light via the surface 81*a* of the optical path changing part 81. The light reflected by the surface of the processed product 100 and further reflected by the surface 81*a* of the optical path changing part 81 enters the detection part 82.

In this case, the detection part 82 can detect the state of the processed product 100 (for example, the end point of the plasma processing) based on the change in the interference light.

The detection part 82 is not limited to the illustrated one, and may be any part that can detect an optical change. For example, the detection part 82 may further include a spectroscope. If the spectroscope is provided, light having a predetermined wavelength can be extracted, so that the detection accuracy can be improved.

Further, in the case of the detection part 82 including the light projecting part and the light receiving part, it is preferable that most of the light reflected by the surface of the processed product 100 is incident on the surface 81*a* of the optical path changing part 81. That is, it is preferable that the optical axis of the inspection light bent by the optical path changing part 81 and the optical axis of the inspection light reflected on the surface of the processed product 100 are substantially the same. For this purpose, it is preferable that the window 23 and the placement part 31 are substantially parallel to each other. However, as described above, when the supporting part 32 that supports the placement part 31 has a cantilever structure, the placement part 31 may tilt. Therefore, when the detection part 82 including the light projecting part and the light receiving part, and the placement part 31 having the cantilever structure are used, it is preferable that the thickness (t1) of the upper side portion of the beam 32*b* is greater than the thickness (t2) of the lower side portion of the beam 32*b* (t1>t2). If "t1>t2", it is easy to make the window 23 and the placement part 31 substantially parallel to each other, and thus it is possible to make the optical axis of the inspection light bent by the optical path changing part 81 and the optical axis of the inspection light reflected by the surface of the processed product 100 substantially the same.

Further, as shown in FIG. 1, the optical path changing part 81 and the detection part 82 can be connected via a light guide part 83. In this case, the light guide part 83 is set to face the surface 81*a* of the optical path changing part 81. The light guide part 83 can be, for example, an optical fiber or the like. The light guide part 83 is not always necessary, and the detection part 82 may be provided near the side surface of the window 23. However, if the light guide part 83 is provided, it becomes easy to provide the detection part 82 at a desired position.

Figure 6:
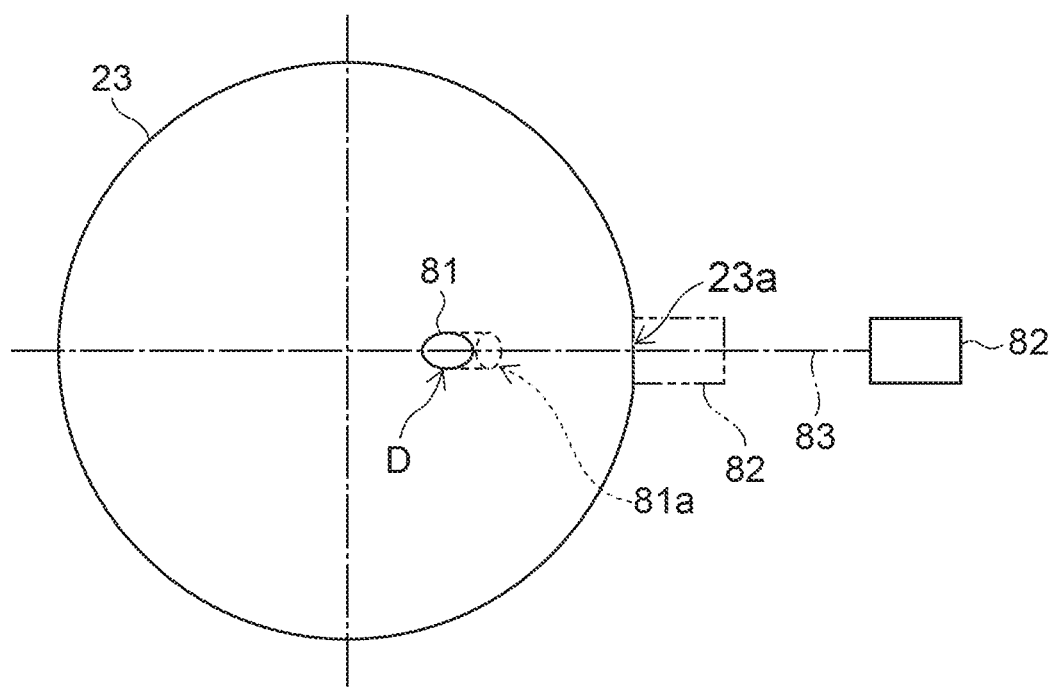
FIG. 6 is a schematic plan view for illustrating a flat surface provided on a side surface of a window.

FIG. 6 is a schematic plan view for illustrating a flat surface provided on the side surface of the window.

As shown in FIG. 6, a flat surface 23*a* can be provided on a portion of the side surface of the window 23 facing the detection part 82 or the light guide part 83. When the light guide part 83 is provided, the light guide part 83 can be provided between the detection part 82 and the side surface 23*a* of the window 23. In this way, the optical connection between the detection part 82 or the light guide part 83 and the window 23 can be facilitated.

Further, if the surface 23a has unevenness, light is scattered by the unevenness, so that it is preferable to increase the flatness of the surface 23a as with the surface 81a. For example, the surface roughness of the surface 23a can be set to Ra 0.02 or less by optical polishing.

It should be noted that the surface 23a and the surface 81a of the optical path changing part 81 are preferably provided so as to be parallel to the vertical direction of the paper surface of FIG. 6, and the vertical direction is orthogonal to the axis 2a. With this configuration, the optical connection between the detection unit 82 or the light guide unit 83 and the optical path changing unit 81 can be facilitated.

Further, the light guide part 83 can include multiple optical fibers. The detection part 82 can include multiple spectroscopes. Then, one optical fiber can be connected to one spectrometer. By doing so, the above-mentioned interference light can be easily detected.

Also, multiple optical path changing parts 81 can be provided. If the multiple optical path changing parts 81 are provided, it is possible to know the processing states at multiple positions. Also, if the optical path changing part 81 used for the detection is selected, it is possible to know the processing states at the multiple positions without increasing the number of detecting units 82.

The controller 9 may include an operation part such as a CPU (Central Processing Unit) and a storage part such as a memory.

The controller 9 can control the operation of each element provided in the plasma processing apparatus 1 based on a control program stored in the storage part. For example, the controller 9 can terminate the plasma processing based on the output from the processing state detection part 8 (detection part 82).

Figure 7A:
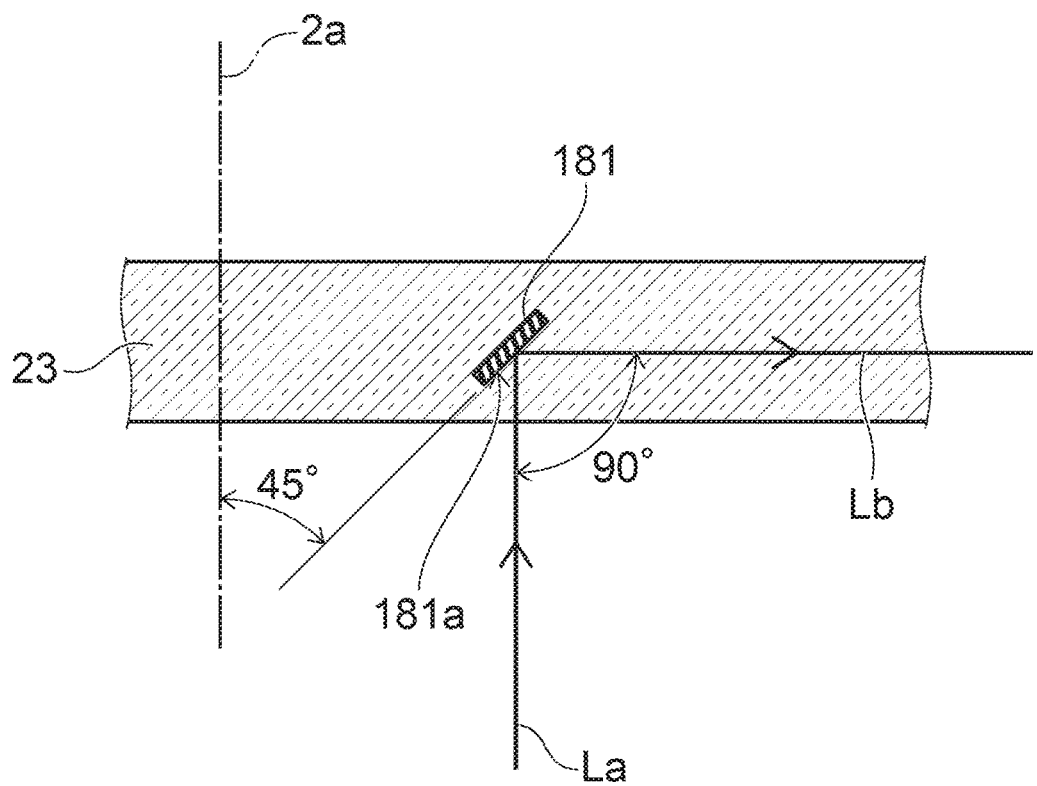
FIGS. 7A and 7B are schematic cross-sectional views for illustrating an optical path changing part according to another embodiment.
Figure 7B:
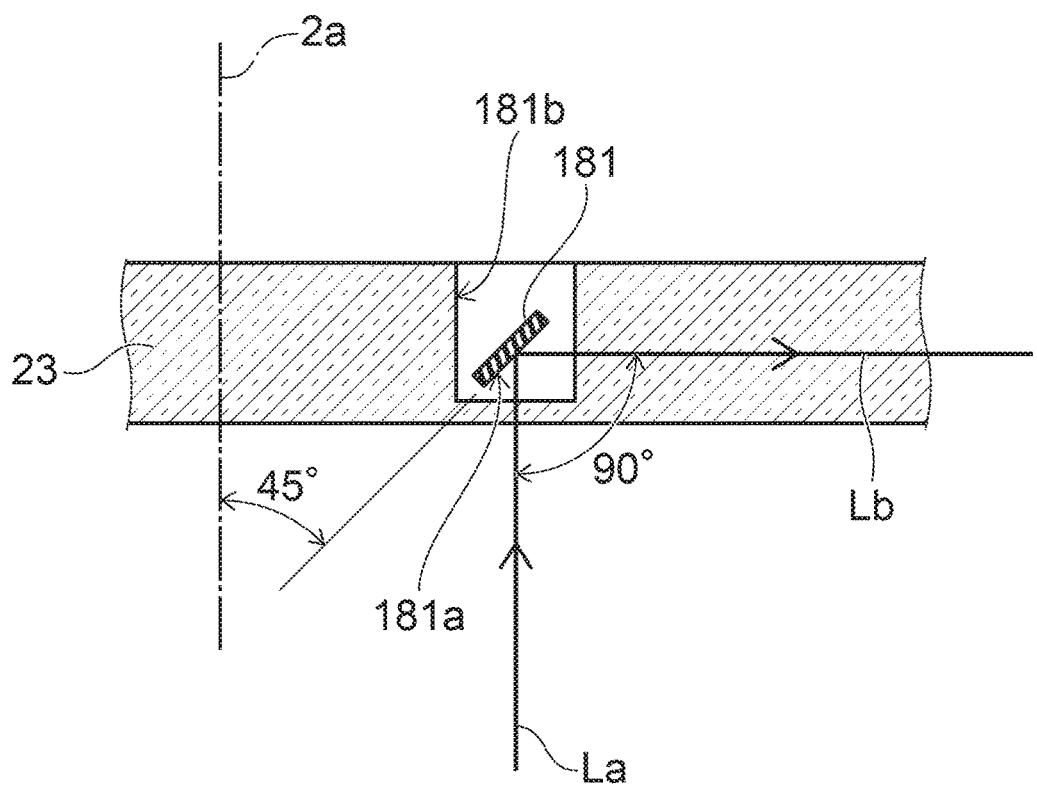

FIGS. 7A and 7B are schematic cross-sectional views for illustrating an optical path changing part 181 according to another embodiment.

As shown in FIGS. 7A and 7B, an optical path changing part 181 can be provided inside the window 23. The optical path changing part 181 may have a flat end surface 181a, and the angle between the end surface 181a and the central axis 2a of the chamber 2 can be 45°.

As shown in FIG. 7A, the optical path changing part 181 can be embedded inside the window 23. For example, the optical path changing part 181 can be embedded, when the window 23 is formed. For example, the optical path changing part 181 can be formed by irradiating the window 23 with a laser and processing the inside of the window 23.

As shown in FIG. 7B, a recess 181b can be provided in the window 23, and an optical path changing part 181 can be provided inside the recess 181b.

The optical path changing part 181 is preferably made of a material having a high reflectance and an insulating property. For example, the optical path changing part 181 can be formed by processing the inside of the window 23, and can be a film including titanium oxide, or the like. The insulating optical path changing part 181 can prevent the optical path changing part 181 from affecting the electromagnetic field formed by the power supply part 5.

Figure 8:
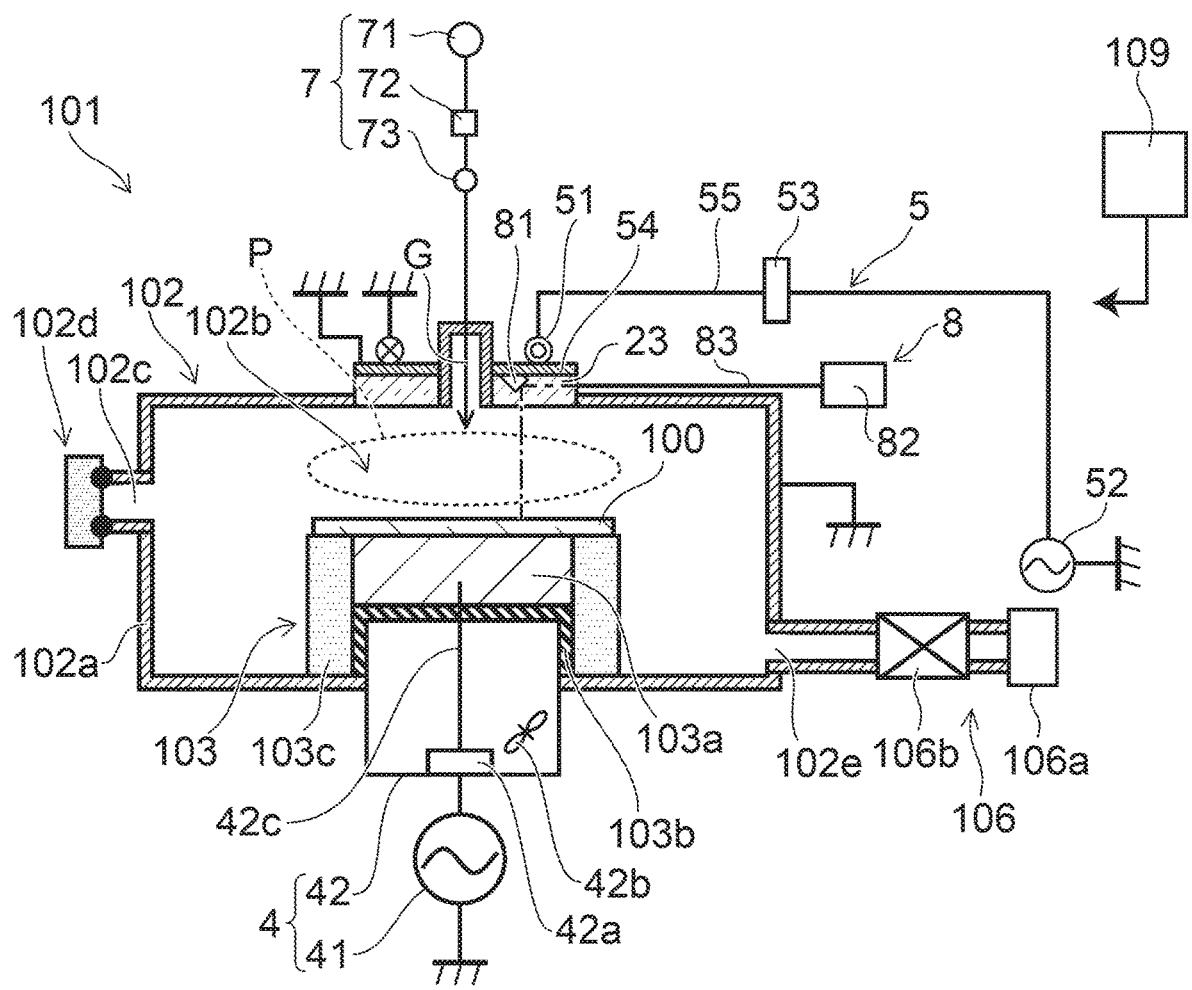
FIG. 8 is a schematic cross-sectional view for illustrating a plasma processing apparatus according to another embodiment.

FIG. 8 is a schematic cross-sectional view for illustrating a plasma processing apparatus according to another embodiment.

As shown in FIG. 8, the plasma processing apparatus 101 may include a chamber 102, a placement part 103, the power supply part 4, the power supply part 5, a depressurization part 106, the gas supply part 7, the processing state detection part 8, and a controller 109. Also in the plasma processing apparatus 101, the power supply part 5 serves as a plasma generation part that generates the plasma P inside the chamber 102.

The chamber 102 can have an airtight structure that can maintain an atmosphere that is depressurized below atmospheric pressure.

The chamber 102 can include a main body part 102a and the window 23.

The main body part 102a may include a top plate, a bottom plate, and a substantially cylindrical side portion integrated with each other. The main body part 102a can be formed of, for example, a metal such as an aluminum alloy. Further, the main body part 102a can be grounded. A region 102b in which the plasma P is generated is provided inside the main body part 102a. The main body part 102a can be provided with a carry-in/carry-out port 102c for carrying in and carrying out the processed product 100. The carry-in/carry-out port 102c can be airtightly closed by a gate valve 102d.

The placement part 103 can be provided inside the chamber 102 (main body part 102a) and on the bottom surface of the main body part 102a. The placement part 103 can include an electrode 103a, a pedestal 103b, and an insulating ring 103c. The inside of the placement part 103 can be connected to an external space (atmosphere space).

The electrode 103a can be provided below the region 102b in which the plasma P is generated. The upper surface of the electrode 103a can be a placement surface on which the processed product 100 is placed. The electrode 103a can be formed of a conductive material such as metal. Further, similar to the electrode 31a described above, the electrode 103a can include multiple pickup pins, a temperature controller, and the like.

The pedestal 103b can be provided between the electrode 103a and the bottom surface of the main body part 102a. The pedestal 103b can be provided to insulate between the electrode 103a and the main body part 102a. The pedestal 103b can be formed of, for example, a dielectric material such as quartz.

The insulating ring 103c presents a ring shape and can be provided so as to cover the side surface of the electrode 103a and the side surface of the pedestal 103b. The insulating ring 103c can be formed of, for example, a dielectric material such as quartz.

The plasma processing apparatus 101 according to the embodiment can also be provided with the above-mentioned power supply part 4. As described above, the power supply part 4 can be a high frequency power supply for so-called bias control. Further, the matching circuit 42a can be electrically connected to the power supply 41 and the electrode 103a via the bus bar 42c. Since the inside of the placement part 103 is connected to the atmosphere space, the bus bar 42c can be in contact with the atmosphere space.

The plasma processing apparatus 101 can also be a dual frequency plasma etching apparatus including an inductively coupled electrode in the upper portion and a capacitively coupled electrode in the lower portion. However, the method of generating plasma is not limited to the illustrated one.

The plasma processing apparatus 101 may be, for example, a plasma processing apparatus that uses inductively coupled plasma (ICP) or a plasma processing apparatus that uses capacitively coupled plasma (CCP).

The depressurization part 106 can include a pump 106a and a pressure controller 106b.

The depressurization part 106 can depressurize the inside of the chamber 102 to a predetermined pressure. The pump 106a may be, for example, a turbo molecular pump or the like. A roots type dry pump can be connected to the turbo molecular pump as the back pump. The pump 106a and the pressure controller 106b can be connected via a pipe.

The pressure controller 106b can control the internal pressure of the chamber 102 to be a predetermined pressure based on the output of a vacuum gauge or the like (not shown) that detects the internal pressure of the chamber 102. The vacuum gauge may be a diaphragm type capacitance manometer or the like. The pressure controller 106b can be, for example, an APC (Auto Pressure Controller) or the like. The pressure controller 106b can be connected to an exhaust port 102e provided in the main body part 102a via a pipe.

The controller 109 may include an operation part such as a CPU and a storage part such as a memory. The controller 109 can control the operation of each element provided in the plasma processing apparatus 101 based on a control program stored in the storage part. For example, the controller 109 can terminate the plasma processing based on the output from the processing state detection part 8 (detection part 82).

The plasma processing apparatus 101 according to the embodiment is also provided with the processing state detection part 8, so that the above-described effects can be enjoyed.

The embodiment has been illustrated. However, the invention is not limited to these descriptions.

Design modification appropriately made by a person skilled in the art in regard to the embodiments described above is within the scope of the invention to the extent that the features of the invention are included.

For example, the shape, the material, the disposition or the like of the components included in the plasma processing apparatuses 1, 101 are not limited to illustrations and can be changed appropriately.

The components included in the embodiments described above can be combined within the extent possible, and the combinations are also included in the scope of the invention to the extent that the features of the invention are included.

What is claimed is:

1. A plasma processing apparatus, comprising:
    a chamber configured to maintain an atmosphere depressurized below atmospheric pressure;
    a gas supply part configured to supply a gas into the chamber;
    a placement part provided inside the chamber, and configured to place a processed product;
    a depressurization part configured to depressurize inside the chamber;
    a window provided in the chamber, and facing the placement part;
    a plasma generator provided outside the chamber and on a surface of the window on an opposite side to the placement part, and configured to generate plasma inside the chamber;
    an optical path changing part provided inside the window and having a surface tilted to a central axis of the chamber; and
    a detection part provided on a side surface side of the window, and facing the surface of the optical path changing part.

2. The plasma processing apparatus according to claim 1, wherein a part of light generated inside the chamber reflects on the surface of the optical path changing part and is configured to be incident on the detection part.

3. The plasma processing apparatus according to claim 1, the detection part, comprising:
    a light projecting part irradiates light onto the surface of the optical path changing part,
    a light receiving part receives interference light, the interference light is generated by the light reflected by the surface of the processed product and traveling toward the light receiving part via the optical path changing part, and the light emitted from the light projecting part.

4. The plasma processing apparatus according to claim 1, wherein the surface of the optical path changing part is flat, and an angle between the surface of the optical path changing part and the central axis of the chamber is 45°.

5. The plasma processing apparatus according to claim 3, wherein the light emitted from the light projecting part of the detection part toward the surface of the optical path changing part is incident at 45° on the surface of the optical path changing part, and reflects at 45°.

6. The plasma processing apparatus according to claim 1, wherein the optical path changing part is a recess opening on a surface of the window on an opposite side to the placement part.

7. The plasma processing apparatus according to claim 1, wherein
    a flat surface is provided on a portion facing the detection part of a side surface of the window, and
    a light guide part is further provided between the flat surface and the detection part.

8. The plasma processing apparatus according to claim 7, wherein
    the light guide part includes a plurality of optical fibers,
    the detection part includes a plurality of spectroscopes, and
    one of the optical fibers is connected to one of the spectroscopes.

9. The plasma processing apparatus according to claim 3, wherein the surface of the optical path changing part is flat, and an angle between the surface of the optical path changing part and the central axis of the chamber is 45°.

10. The plasma processing apparatus according to claim 9, wherein the light emitted from the light projecting part of the detection part toward the surface of the optical path changing part is incident at 45° on the surface of the optical path changing part, and reflects at 45°.

11. The plasma processing apparatus according to claim 3, wherein the optical path changing part is a recess opening on a surface of the window on an opposite side to the placement part.

12. The plasma processing apparatus according to claim 10, wherein the optical path changing part is a recess opening on a surface of the window on an opposite side to the placement part.

13. The plasma processing apparatus according to claim 3, wherein
    a flat surface is provided on a portion facing the detection part of a side surface of the window, and
    a light guide part is further provided between the flat surface and the detection part.

14. The plasma processing apparatus according to claim 11, wherein
    a flat surface is provided on a portion facing the detection part of a side surface of the window, and
    a light guide part is further provided between the flat surface and the detection part.

15. The plasma processing apparatus according to claim 12, wherein
    a flat surface is provided on a portion facing the detection part of a side surface of the window, and a light guide part is further provided between the flat surface and the detection part.

16. The plasma processing apparatus according to claim 13, wherein
the light guide part includes a plurality of optical fibers,
the detection part includes a plurality of spectroscopes, and
one of the optical fibers is connected to one of the spectroscopes.

17. The plasma processing apparatus according to claim 14, wherein
the light guide part includes a plurality of optical fibers,
the detection part includes a plurality of spectroscopes, and
one of the optical fibers is connected to one of the spectroscopes.

18. The plasma processing apparatus according to claim 15, wherein
the light guide part includes a plurality of optical fibers,
the detection part includes a plurality of spectroscopes, and
one of the optical fibers is connected to one of the spectroscopes.

* * * * *